(12) United States Patent
Shieh et al.

(10) Patent No.: US 7,606,068 B2
(45) Date of Patent: Oct. 20, 2009

(54) MEMORY WITH A CORE-BASED VIRTUAL GROUND AND DYNAMIC REFERENCE SENSING SCHEME

(75) Inventors: Ming-Huei Shieh, Cupertino, CA (US); Kazuhiro Kurihara, Tokyo (JP)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 12/017,693

(22) Filed: Jan. 22, 2008

(65) Prior Publication Data

US 2008/0117678 A1 May 22, 2008

Related U.S. Application Data

(63) Continuation of application No. 10/600,065, filed on Jun. 20, 2003, now Pat. No. 7,324,374.

(51) Int. Cl.
G11C 11/34 (2006.01)

(52) U.S. Cl. .............................. 365/185.03; 365/185.01; 365/185.05

(58) Field of Classification Search ............ 365/185.03, 365/185.01, 185.05, 185.07, 185.2, 185.33, 365/185.21, 185.09, 185.25
See application file for complete search history.

(56) References Cited

U.S. PATENT DOCUMENTS

| 5,218,566 | A | 6/1993 | Papaliolios |
| 5,497,354 | A | 3/1996 | Sweha et al. |
| 5,537,358 | A | 7/1996 | Fong |
| 5,675,537 | A | 10/1997 | Bill et al. |
| 5,754,475 | A | 5/1998 | Bill et al. |
| 5,973,966 | A | 10/1999 | Calligaro et al. |
| 6,538,922 | B1 | 3/2003 | Khalid et al. |
| 6,538,942 | B2 | 3/2003 | Ferrant |
| 6,643,177 | B1 | 11/2003 | Le et al. |
| 6,690,602 | B1 | 2/2004 | Le et al. |
| 6,738,303 | B1 * | 5/2004 | Subramanian et al. . 365/189.07 |
| 6,791,880 | B1 | 9/2004 | Kurihara et al. |
| 6,888,767 | B1 | 5/2005 | Han |
| 2001/0019500 | A1 | 9/2001 | Banks |
| 2002/0145910 | A1 | 10/2002 | Kern et al. |
| 2003/0031059 | A1 | 2/2003 | Endo et al. |
| 2003/0208663 | A1 * | 11/2003 | Van Buskirk et al. ....... 711/156 |
| 2006/0077737 | A1 * | 4/2006 | Ooishi ........................ 365/203 |

FOREIGN PATENT DOCUMENTS

WO 03088261 A 10/2003

OTHER PUBLICATIONS

W. Gaertner; International Search Report, PCT/US2004/016015; Oct. 25, 2004.

* cited by examiner

*Primary Examiner*—Dang T Nguyen
(74) *Attorney, Agent, or Firm*—Turocy & Watson, LLP

(57) ABSTRACT

A core-based multi-bit memory (400) having a dual-bit dynamic referencing architecture (408, 410) fabricated on the memory core (401). A first reference array (408) and a second reference array (410) are fabricated on the memory core (401) such that a reference cell pair (185) comprising one cell (182) of the first reference array (408) and a corresponding cell (184) of the second reference array (410) are read and averaged to provide a reference voltage for reading a data array(s).

13 Claims, 12 Drawing Sheets

MEMORY WITH A CORE-BASED VIRTUAL GROUND AND DYNAMIC REFERENCE SENSING SCHEME

CROSS REFERENCE TO RELATED APPLICATIONS

This application is a continuation of U.S. patent application Ser. No. 10/600,065, filed on Jun. 20, 2003, entitled "MEMORY WITH A CORE-BASED VIRTUAL GROUND AND DYNAMIC REFERENCE SENSING SCHEME", the entirety of which is incorporated herein by reference.

TECHNICAL FIELD

This invention is related to multi-bit chip memory, and more specifically, to methods and systems for on-chip placement of referencing circuitry in a multi-bit memory device.

BACKGROUND OF THE INVENTION

The use of portable computer and electronic devices has greatly increased demand for memory devices. Digital cameras, digital audio players, personal digital assistants, and the like generally seek to employ large capacity memory devices (e.g., flash memory, smart media, compact flash, . . . ). The increased demand for information storage is commensurate with memory devices having an ever-increasing storage capacity (e.g., increase storage per die or chip). A postage-stamp-sized piece of silicon may contain, for example, tens of millions of transistors, each transistor as small as a few hundred nanometers. However, silicon-based devices are approaching their fundamental physical size limits. Inorganic solid-state devices are generally encumbered with a complex architecture that leads to high cost and a loss of data storage density. The volatile semiconductor memories based on inorganic semiconductor material must constantly be supplied with electric current with a resulting heating and high electric power consumption in order to maintain stored information. Non-volatile semiconductor devices have a reduced data rate and relatively high power consumption and large degree of complexity.

Flash memory is a type of electronic memory media that can be rewritten and that can retain content without consumption of power. Flash memory devices generally have life spans from 100K to 300K write cycles. Unlike dynamic random access memory (DRAM) devices and static random memory (SRAM) devices in which a single byte can be erased, flash memory devices are typically erased and written in fixed multi-bit blocks or sectors. Flash memory technology evolved from electrically erasable read only memory (EEPROM) chip technology, which can be erased in situ. Flash memory devices are less expensive and more dense as compared to many other memory devices, meaning that flash memory devices can store more data per unit area. This new category of EEPROMs has emerged as an important non-volatile memory that combines advantages of erasable programmable read only memory (EPROM) density with EEPROM electrical erasability.

Conventional flash memory devices are constructed in a cell structure wherein a single bit of information is stored in each cell. In such single bit memory architectures, each cell typically includes a metal oxide semiconductor (MOS) transistor structure having a source, a drain, and a channel in a substrate or P-well, as well as having a stacked gate structure overlying a channel. The stacked gate may further include a thin gate dielectric layer (sometimes referred to as a layer of tunnel oxide) formed on the surface of a substrate or P-well. The stacked gate also includes a polysilicon floating gate overlying the tunnel oxide and an interpoly dielectric layer overlying the floating gate. The interpoly dielectric is often a multilayer insulator such as an oxide-nitride-oxide (ONO) layer having two oxide layers sandwiching a nitride layer. Lastly, a polysilicon control gate overlies the interpoly dielectric layer.

The control gate is connected to a wordline associated with a row of such cells to form sectors of such cell in a typical NOR configuration. In addition, the drain regions of the cells are connected together by a conductive bitline. The channel of the cell formed between the source and drain regions conducts current between the source and drain in accordance with an electric field formed in the channel by a voltage applied to the stacked gate structure by a wordline attached to the stacked gate structure. In the NOR configuration, each drain terminal of the transistors within a column is connected to the same bitline. In addition, the stacked gate structure of each flash cell in a row is connected to the same wordline. Typically, the source terminal of each cell is connected to a common source terminal. In operation, individual flash cells are addressed via the respective bitline and wordline employing peripheral decoder and control circuitry for programming (writing), reading and erasing the cell.

The single bit stacked gate flash memory cell is programmed by applying a programming voltage to the control gate, connecting the source to ground and connecting the drain to a programming voltage. The resulting high electric field across the tunnel oxide results in a phenomenon deemed "Fowler-Nordheim" tunneling. During Fowler-Nordheim tunneling, electrons in the channel region tunnel through the gate oxide into the floating gate and become trapped in the floating gate. As a result of the trapped electrons, the threshold voltage of the cell increases. This change in the threshold voltage VT (and thereby the channel conductance) of the cell created by the trapped electrons causes the cell to be programmed.

In order to erase a typical single bit stacked gate flash memory cell, a voltage is applied to the source, the control gate is held at a negative potential, and the drain is allowed to float. Under these conditions, an electric field is developed across the tunnel oxide between the floating gate and the source. The electrons that are trapped in the floating gate flow toward and cluster at a portion of the floating gate overlying the source region. The electrons are then extracted from the floating gate and into the source region by way of Fowler-Nordheim tunneling through the tunnel oxide. The cell is erased as the electrons are removed from the floating gate.

In conventional single bit flash memory devices, erase verification is performed to determine whether each cell in a block or set of cells has been properly erased. Current single bit erase verification methodologies provide for verification of bit or cell erasure, and application of supplemental erase pulses to individual cells that fail the initial verification. Thereafter, the erased status of the cell is again verified and the process continues until the cell or bit is successfully erased or the cell is marked as unusable.

Recently, multi-bit flash memory cells have been introduced that allow the storage of multiple bits of information in a single memory cell. Techniques that have been developed with conventional single bit flash memory devices do not work well for the new multiple bit flash memory cells. For example, a dual bit flash memory structure has been introduced that does not utilize a floating gate, such as an ONO flash memory device that employs a polysilicon layer over the ONO layer for providing wordline connections. In a dual bit memory device, one side of a dual bit memory cell is called a complimentary bit (CB) and the other side of the dual bit memory cell is called a normal bit (NB). The dual bit memory cell uses a layer of nitride in an ONO (oxide-nitride-oxide) stack to store charge; and since nitride is not a conductor, the charge added or removed during the program and erase operations should not redistribute to other regions of the layer of nitride. However, the buildup of charge and leakage in one bit does effect the other bit changing the reading, programming and erase characteristics of the cell in subsequent cycles. Eventually, the buildup of residual or leakage charge changes the effective VT of the CB and the NB.

One significant problem with dual bit operation is a result of a shift in a blank read current of the complimentary bit when the normal bit is programmed and a shift in the blank read current in the normal bit when the complimentary bit is programmed. This shift in VT with the other side programmed is called "CBD" or complimentary bit disturb. The CB and NB regions are near the drain/source junctions of the cell and are modified during programming and erase operations. Another problem is caused by charge loss after cycling of the cell. Therefore, a major challenge for dual bit operation manifests from the combination of the charge loss and complimentary bit disturb under the two conditions: (1) CBD at BOL (beginning of life) and (2) charge loss post cycling at EOL (end of life or post bake). Test data indicates that the CBD is higher near the BOL and the VT distributions overlay the program VT after cycling and bake (EOL). The overlap of the two distributions prevents normal read sensing schemes from working correctly for dual bit operations. In other words, it cannot be determined whether the data in a CB or NB is a one or a zero because as the VT distributions approach each other.

However, multi-bit architecture introduces an additional level of complexity related to voltage margins when determining whether a bit is in a high state or a low state. When using a fixed reference voltage, aging effects of that reference voltage introduces a reliability factor in that as the reference voltage bleeds down, bit states referenced to this aging voltage can determined differently than what the state actually should be. Thus what is needed is a more reliable referencing system that mitigates the effects of aging.

SUMMARY OF THE INVENTION

The following presents a simplified summary of the invention in order to provide a basic understanding of some aspects of the invention. This summary is not an extensive overview of the invention. It is intended to neither identify key or critical elements of the invention nor delineate the scope of the invention. Its purpose is merely to present some concepts of the invention in a simplified form as a prelude to the more detailed description that is presented later.

The present invention disclosed and claimed herein, in one aspect thereof, comprises a method for placement of dynamic referencing circuitry internal to the chip, that is, with the core circuitry such that referencing can be performed dynamically among a number of different multi-bit reference pairs of the core that more accurately represent the reference voltage of the core. The invention includes placing the voltage reference cells in the core and cycling the reference voltage cells along with the data cells such that the effects of aging on the reference voltage is significantly reduced.

Since the disclosed multi-bit technology uses four voltage levels associated with four binary states of 00, 01, 10, and 11, where binary 00 is associated with a high VT state, and binary 11 is associated with a low VT state, the voltage margin at the center states is small. That is, binary 01 is slight lower in value than binary 00 (but higher than the binary 10 state), and binary 10 is slightly higher than the binary 11 level, but lower than the binary 01 state. Thus the voltage margin between the binary 01 and 10 states is small. In order to compensate for such close margin problems, two reference arrays are fabricated in the core electronics: a first reference array, Ref A (always for reading cells), includes a plurality of cells fixed at the voltage associated with the binary 10 level; and a second reference array, Ref B, includes a plurality of cells fixed at the voltage associated with the binary 01 level. Thus when a data cell read operation is performed, a reference A/B pair is also read and averaged to determined the proper reference voltage.

The two reference arrays of multi-bit reference cells are provided in association with a plurality of multi-bit data sectors. That is, the first and second reference arrays are fabricated adjacent to one another, both of which are interstitial to the plurality of memory core data sectors. Thus when determining dynamically the reference voltage by averaging select ones of the respective first and second reference cells, the derived reference voltage is more accurate with respect to the data bit values of the data sectors.

To the accomplishment of the foregoing and related ends, certain illustrative aspects of the invention are described herein in connection with the following description and the drawings. These aspects are indicative, however, of but a few of the various ways in which the principles of the invention may be employed, and the present invention is intended to include all such aspects and their equivalents. It is to be appreciated that other objects, advantages, and novel features of the invention will become apparent from the following detailed description of the invention when considered in conjunction with the drawings.

DETAILED DESCRIPTION OF THE INVENTION

Figure 1:
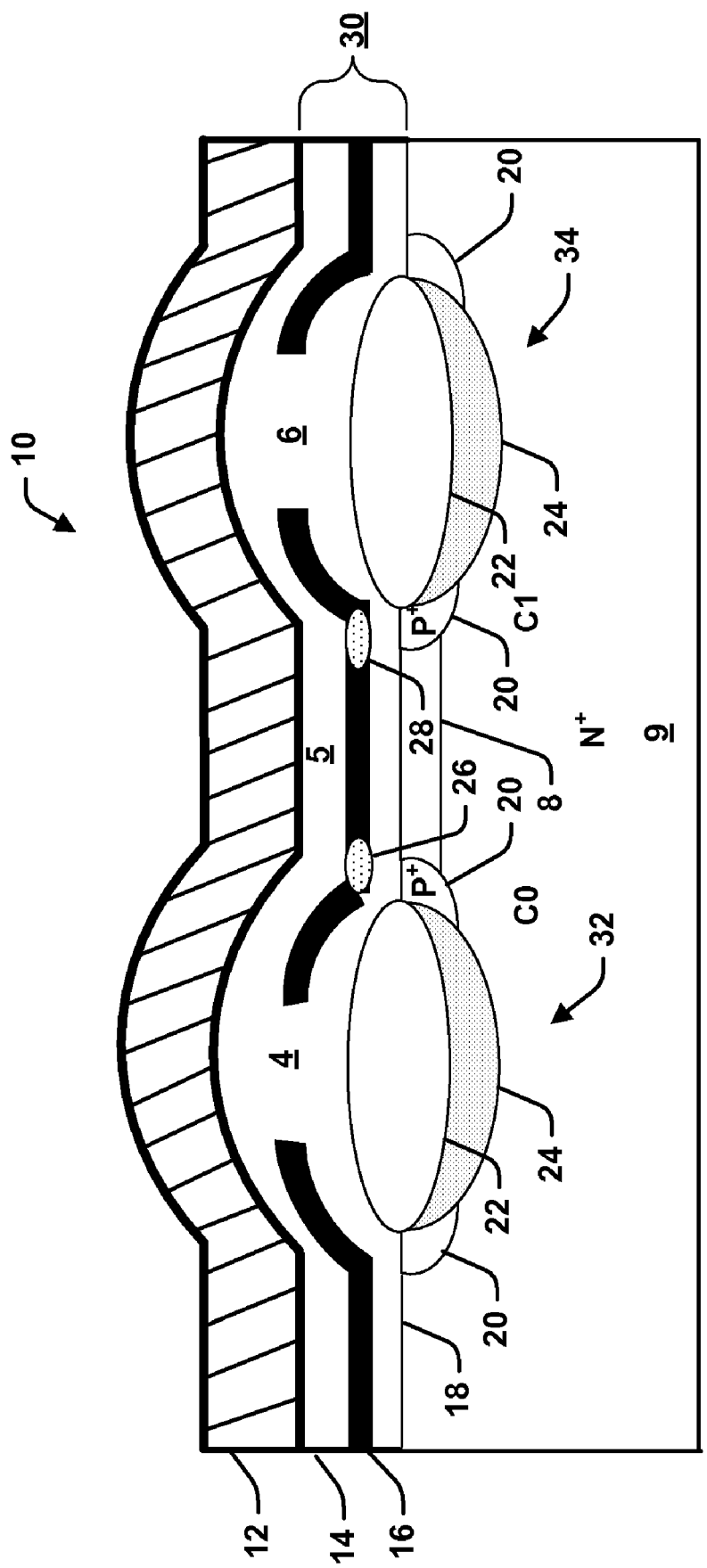
FIG. 1 illustrates a side cross-sectional view of an exemplary dual bit memory cell in which various aspects of the present invention may be implemented.

The present invention is now described with reference to the drawings, wherein like reference numerals are used to refer to like elements throughout. In the following description, for purposes of explanation, numerous specific details are set forth in order to provide a thorough understanding of the present invention. It may be evident, however, that the present invention may be practiced without these specific details. In other instances, well-known structures and devices are shown in block diagram form in order to facilitate describing the present invention.

Referring now to FIG. 1, there is illustrated an exemplary dual bit memory cell 10 in which one or more of the various aspects of the invention may be carried out. The memory cell 10 comprises a silicon nitride layer 16 sandwiched between a top silicon dioxide layer 14 and a bottom silicon dioxide layer 18 forming an ONO layer 30. A polysilicon layer 12 resides over the ONO layer 30 and provides a wordline connection to the memory cell 10. A first bitline 32 runs underneath the ONO layer 30 under a first region 4 and a second bitline 34 runs underneath the ONO layer 30 under a second region 6. The bitlines 32 and 34 are formed of a conductive portion 24 and an optional oxide portion 22. Boron core implants 20 are provided on both ends of each bitline 32 and 34 where the bitlines meet the bottom silicon dioxide layer 18 or along the entire transistor. The boron core implants are more heavily doped than the P-type substrate and assist in control of the VT of the memory cell 10. The cell 10 resides on a P-type substrate 9 with the conductive portion 24 of the bitlines 32 and 34 being formed from an N+ arsenic implant, such that a channel 8 is formed between the bitlines 32 and 34 and across the P-type substrate. The memory cell 10 is comprised of a single transistor having interchangeable source and drain components formed from the N+ arsenic implant portions 24 residing on the P-type substrate region 9 with a gate formed as part of a polysilicon wordline 12.

Although the first and second bitlines 32 and 34 are illustrated with respect to a conductive portion 24 and an optional oxide portion 22, it is appreciated that the bitlines can be formed from a conductive portion only. Furthermore, although the drawing of FIG. 1 illustrates gaps in the silicon nitride layer 16, it is to be appreciated that the silicon nitride layer 16 may be fabricated with out gaps as a single strip or layer.

The silicon nitride layer 16 forms a charge trapping layer. Programming of the cell is accomplished by applying voltages to the drain and the gate and grounding the source. The voltages generate electrical fields along the channel causing electrons to accelerate and jump from the substrate layer 9 into the nitride that is known as hot electron injection. Since the electrons gain the most energy at the drain, these electrons become trapped and remain stored in the nitride layer near the drain. The cell 10 is generally uniform and the drain and source are interchangeable. Since the silicon nitride is non-conducting, a first charge 26 can be injected into the nitride 16 near a first end of the central region 5 and a second charge 28 can be injected into the nitride 16 near a second end of the central region 5. Therefore, if the charge does not move then there can be two bits per cell instead of one bit.

As previously noted, the first charge 26 can be stored in the nitride layer 16 at the first end of the central region 5 and the second charge 28 can be stored at the second end of the central region 5 such that two bits can reside per memory cell 10. The dual bit memory cell 10 is generally symmetrical, thus the drain and the source can be interchangeable. Thus, the first bitline 32 can serve as the drain terminal and the second bitline 34 as the source terminal when programming the left bit C0. Likewise, the second bitline 34 can serve as the drain terminal and the first bit line 32 as the source terminal for programming the right bit C1. Table 1 illustrates one particular set of voltage parameters for performing reading, programming and single sided erases of the dual bit memory cell 10 having the first bit C0 and the second bit C1.

TABLE 1

| Voltage Parameters. | | | | | |
|---|---|---|---|---|---|
| Operation | Cell | Gate | Bitline 0 | Bitline 1 | Comment |
| Read | C0 | Vcc | 0 v | 1.2 v | complimentary column |
| Read | C1 | Vcc | 1.2 v | 0 v | normal column |
| program | C0 | Vpp | 5-6 v | 0 v | Hot electron |
| program | C1 | Vpp | 0 v | 5-6 v | Hot electron |
| One side - Erase | C0 | −3 to −6 v | 5-6 v | Float | Hot hole injection |
| One side - Erase | C1 | −3 to −6 v | Float | 5-6 v | Hot hole injection |

Various implementations of dual bit memory cell architecture may be achieved according to one or more aspects of the present invention. In particular, the invention is applicable to memory devices wherein both bits in a dual bit cell are employed for data or information storage. The inventors of the present invention have found that program and erasure of one bit (e.g., bit C0) in such a cell effects programming, reading and/or erasure of its associated bit (e.g., bit C1). For example, repeated programming of bit C1 of cell 10 can cause charge accumulation in bit C0 and vice versa. In addition, repeated application of erase voltage pulses to bit C1 can cause over erasure of bit C0. These phenomena in the associated bit C0 can in turn result in degradation with respect to operation of the bits during normal operation (e.g., the ability to effectively read, write/program, and/or erase one or both bits).

The inventors have determined that a major challenge for dual bit operation comes from the combination of the charge loss and complimentary bit disturb (CBD) under the two conditions: (1) CBD at BOL (beginning of life) and (2) charge loss post cycling at EOL (end of life or post bake). Test data indicates that the CBD is higher near the BOL and the VT distributions overlay the program VT after cycling and bake (EOL). The overlap of the two distributions prevents normal read sensing schemes from working correctly for dual bit operations. In other words, it cannot be determined whether the data in a CB or NB is a one or a zero.

Many flash memories are provided with command logic and embedded state machines that perform complex programming and erasing operations automatically. A static random access memory (SRAM) module component can include the programs implemented by a micro-controller for use in controlling operations of command logic and a memory system. These programs are typically loaded into an SRAM when a system is powered up. A bus can be used to send control commands from a processor to the command logic device and to exchange the data read from or written to the flash memory device with the command logic and a host processor. The embedded state machines of the flash device generate the command logic controls for detailed operations such as the various individual steps necessary for carrying out programming, reading and erasing operations. The state machine thus functions to reduce overhead required of a processor (not depicted) typically used in association with a microchip containing the flash memory.

Figure 2:
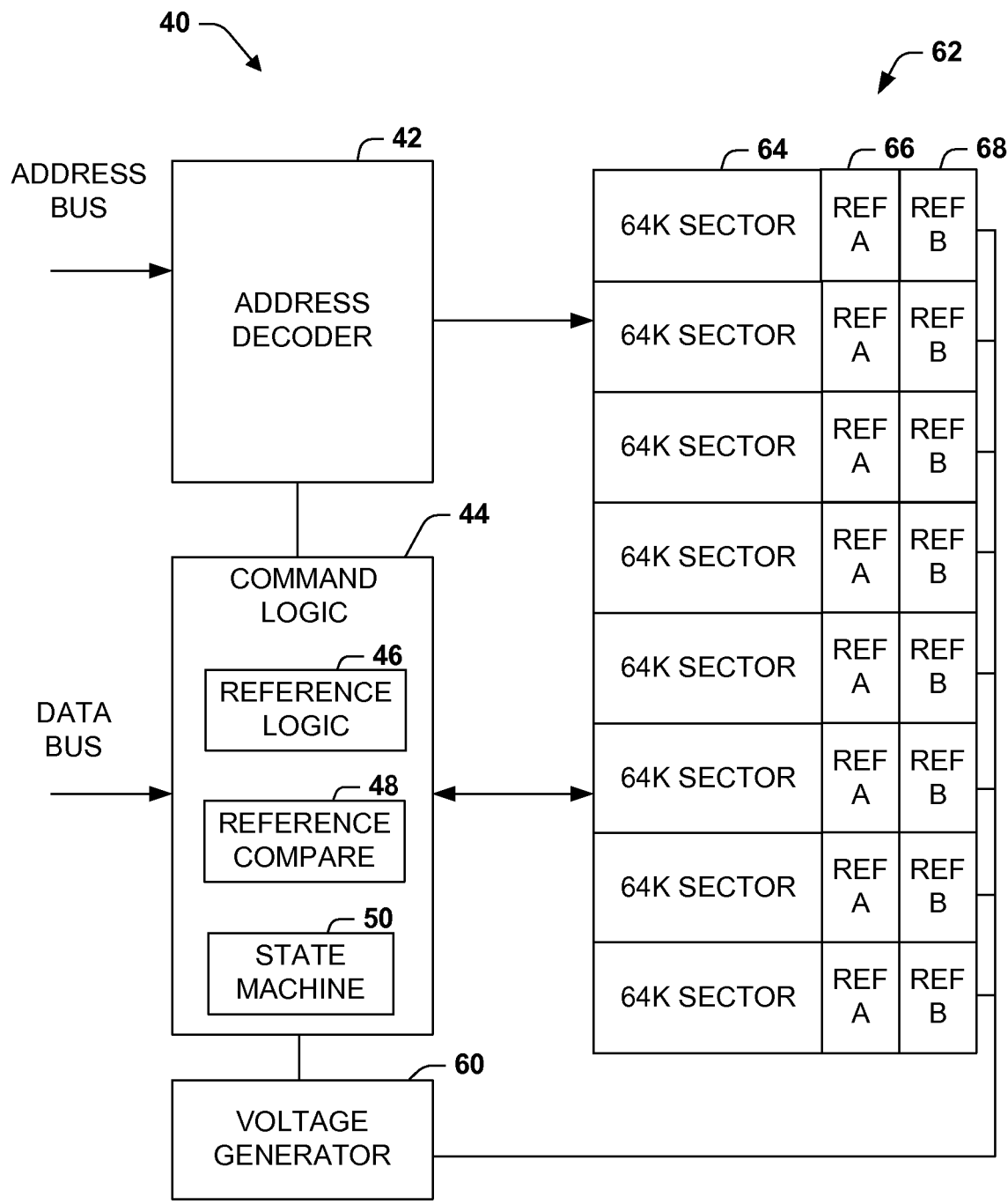
FIG. 2 illustrates a block diagram of a system adapted to carry out various aspects of the invention.

Referring now to FIG. 2, there is illustrated a system 40 for performing proper programming, erasing and reading of a memory array 62 employing the dual bit memory cells of the present invention. In the present example, the memory array 62 is comprised of a plurality of 64K sectors 64. A sector of the flash memory array 64 includes a portion of the memory array 62 consisting of all the memory cells grouped together via the wordlines that share the same sector address. The sector address is typically the n (e.g., six) most significant address bits of the address bit signals used to address one or more cells in the memory device where n is an integer. For example, a 64K sector 64 can be comprised of 8 I/Os (input/outputs) where an I/O is a row of 4 cells or 4 dual bit memory cells having 4 normal bits and 4 complimentary. It is to be appreciated that the memory array 62 can be any number of different configurations, for example, 128K sectors comprised of 8 normal bits and 8 complimentary bits on 8 cells. In addition any number of sectors may be employed only limited by the size of the application and the size of the device employing the flash memory array 62.

Associated with each 64K sector 64 is a first dynamic reference array 66 and a second dynamic reference array 68. The first dynamic reference array 66 tracks charge loss of data bits associated with the cycling the sector 64 and the second dynamic reference array tracks the effects of CBD on the data bits associated with cycling of the sector 64. The first dynamic reference array 66 and the second dynamic reference array 68 are cycled with the data bits of a corresponding sector 64 so that the reference arrays age with the corresponding sector 64. The reference array 66 and 68 can include reference cells associated with words, wordlines or sectors.

The system 40 includes an address decoder 42 connected to the flash memory array 62 for decoding IOs during various operations that are performed on the array 62 (e.g., programming, reading, verifying, erasing). The address decoder 42 receives address bus information from a system controller (not shown) or the like.

A command logic component 44 includes, a reference logic component 46, a reference comparator component 48 and an internal state machine 50. The command logic component 44 is connected to the address memory array 62. The command logic and state machine 50 receives commands or instructions from a data bus connected to a system controller or the like. The commands or instructions invoke algorithms embedded in the command logic 44 and state machine 50. The algorithms perform various methodologies of programming, reading, erasing, soft programming and verifying to be described herein. A voltage generator component 60 is also connected to the memory array 62 and the command logic 44 and state machine 50. The voltage generator component 60 is controlled by the command logic 44 and state machine 50. The voltage generator component 60 is operable to generate necessary voltages for programming, reading, erasing, soft programming and verifying of the memory cells of the memory array 62.

During a program and erase cycle of a sector, the command logic 44 and state machine 50 program the data bits in the sector and the reference bits in the first reference array 66 and the second reference array 68. The command logic 44 and state machine 50 then erase the data bits in the sector and the reference bits in the first reference array 66 and the second reference array 68. The command logic 44 and state machine 50 then program one bit of the reference cells in the first reference array 66 and program one bit of the reference cells in the second reference array 68. During a read operation, a data bit is read, for example, by reading one or more words in a sector. The command logic 44 and state machine 50 reads a programmed bit from a cell in the first reference array 66 and reads an erased bit from a cell in the second reference array 68. The read values are provided to the reference logic component 46 which determines an average reference value (e.g., VTAVG). The average reference value is provided to a reference compare component 48. The reference compare component 48 compares the reference value with the read data bits to determine if the bits are in a programmed state or an unprogrammed state.

Figure 3:
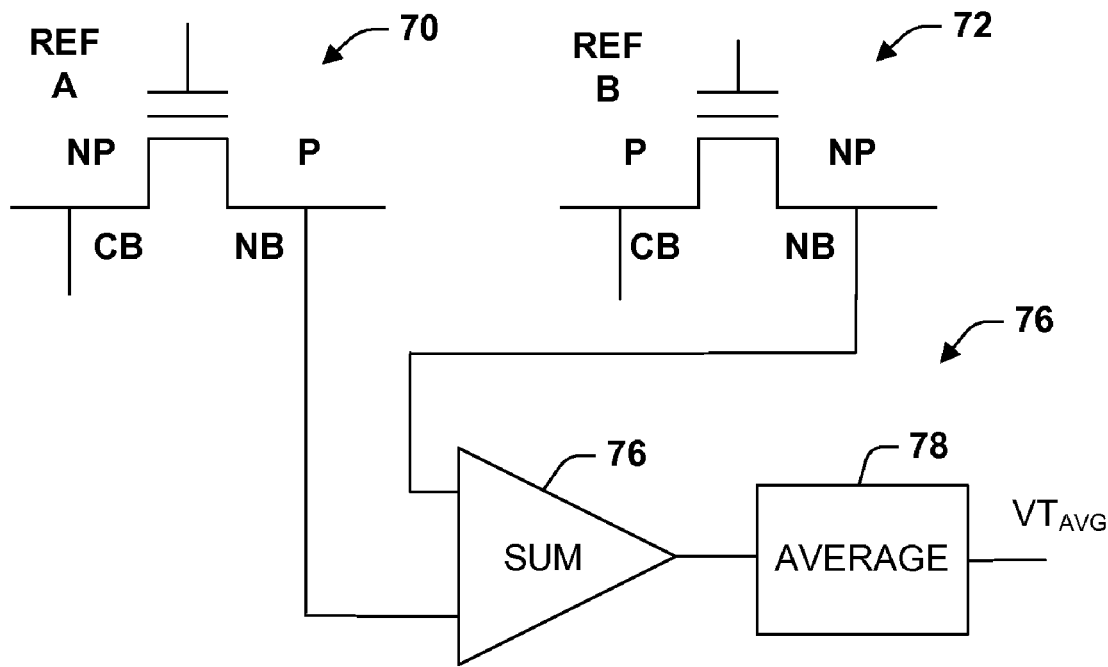
FIG. 3 illustrates a schematic block diagram of a circuit for determining an average threshold value using normal bits of two reference cells in accordance with an aspect of the present invention.

Referring now to FIG. 3, there is illustrated a circuit 76 for determining a voltage threshold average (VTAVG) from two dual bit reference cells in accordance with an aspect of the present invention. A first reference cell 70 (REF A) includes a complimentary bit (CB) and a normal bit (NB). The NB is programmed (P) and the CB is unprogrammed (NP). A second reference cell 72 (REF B) includes a CB and an NB. The CB is programmed (P) and the NB is unprogrammed (NP). During a read operation, a summer 76 sums the read currents of the programmed NB of the first reference cell 70 and the unprogrammed NB of the second reference cell 72. The summer 76 converts the currents to a voltage and provides the voltage to an average component 78. The average component 78 can be, for example, a simple voltage divider. The average component 78 then provides the average reference threshold voltage VTAVG. VTAVG can be used to determine whether a data bit is a programmed bit or an unprogrammed bit. It is to be appreciated that VTAVG can be determined from summing the unprogrammed CB of the first reference cell 70 with the programmed CB of the second reference cell 72.

Figure 4:
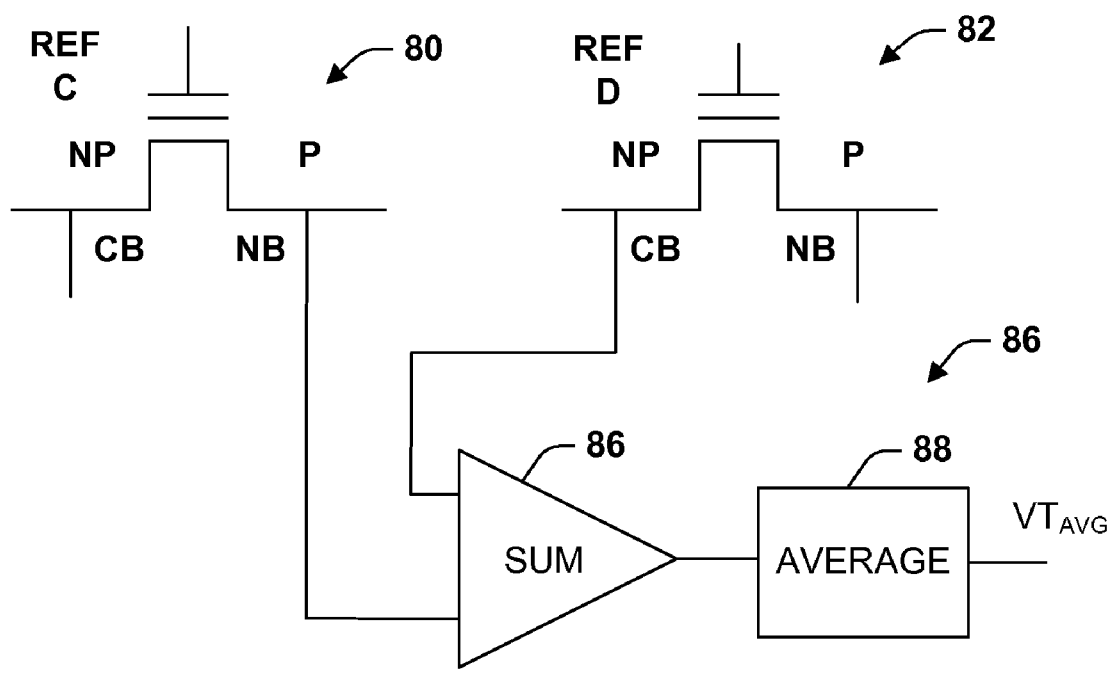
FIG. 4 illustrates a schematic block diagram of a circuit for determining an average threshold value using a normal bit of a first reference cell and a complimentary bit of a second reference cell in accordance with an aspect of the present invention.

Referring now to FIG. 4, there is illustrated a circuit 86 for determining a voltage threshold average (VTAVG) from two dual bit reference cells in accordance with another aspect of the present invention. A first reference cell 80 (REF C) includes a CB and an NB. The NB is programmed (P) and the CB is unprogrammed (NP). A second reference cell 82 (REF D) includes a CB and an NB. The CB is unprogrammed (P) and the NB is programmed (NP). During a read operation, a summer 86 sums the read currents of the programmed NB of the first reference cell 80 and the unprogrammed CB of the second reference cell 82. The summer 86 converts the currents to a voltage and provides the voltage to an average component 88. The average component 88 then provides the average reference threshold voltage VTAVG. VTAVG can be employed to determine whether a data bit is a programmed bit or an unprogrammed bit. It is to be appreciated that VTAVG can be determined from summing the unprogrammed CB of the first reference cell 80 with the programmed NB of the second reference cell 82. FIGS. 3-4 illustrate that any suitable combination of programmed bit of one reference combined with an unprogrammed bit of another reference can be employed to determine VTAVG.

Figure 5:
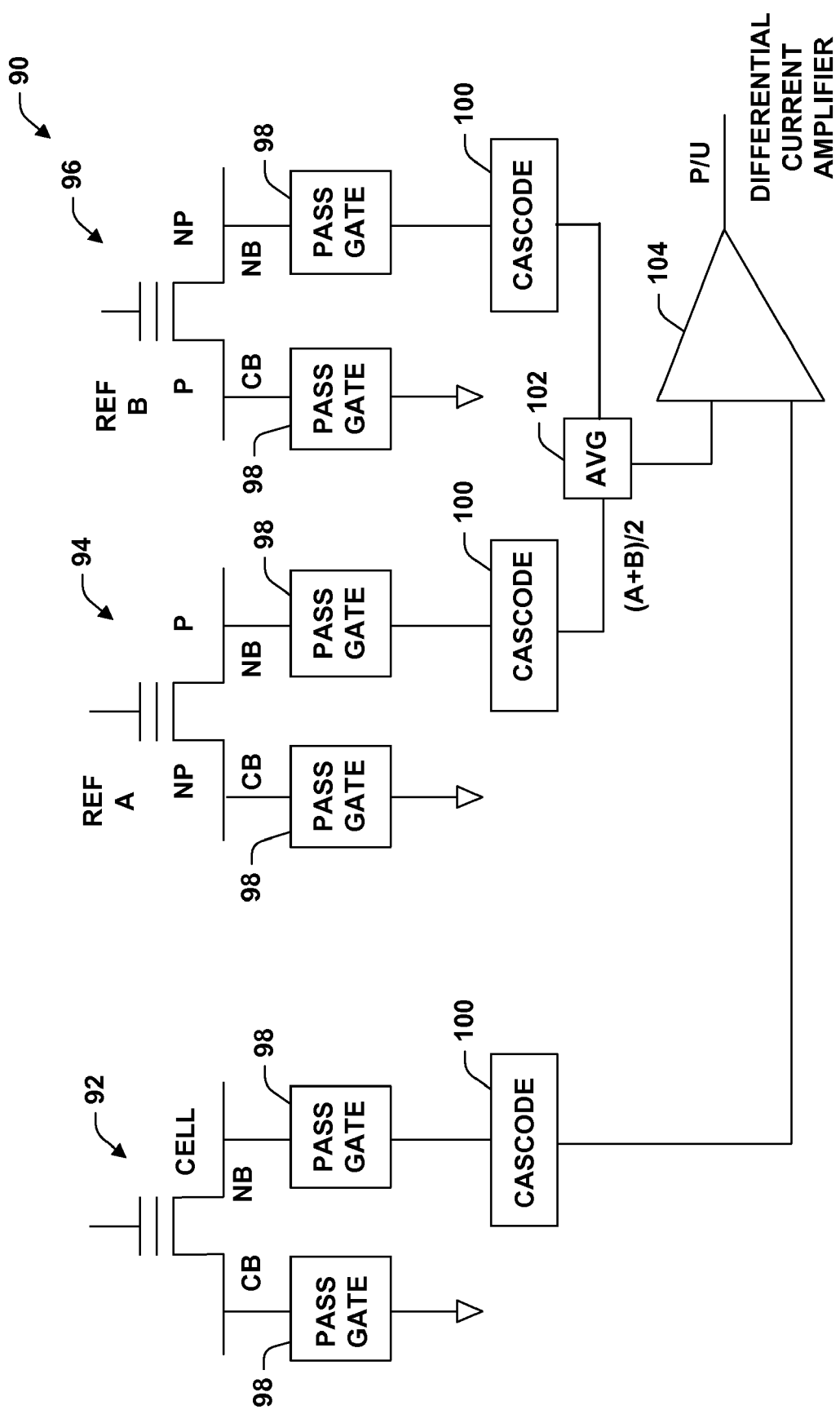
FIG. 5 illustrates a schematic block diagram of a comparison circuit in accordance with an aspect of the present invention.

Referring now to FIG. 5, there is illustrated a schematic diagram of a comparison circuit 90 having a data cell 92, a first reference cell 94 from dynamic reference A, and a second reference cell 96 from dynamic reference B. The data cell 92 has a CB and an NB. The reference cells 94 and 96 also have a CB and an NB. Associated pass gates 98 are connected to the CB and NB sides of the cells 92, 94, and 96. In the example illustrated in FIG. 5, the data from the NB side of cell 92 is being compared to averaged data from the NB sides of dynamic reference cells 94 and 96. In this example, the NB of one reference cell would be programmed and the NB of the other cell would be unprogrammed.

As should be appreciated, if the data from the CB side of cell 92 is to be compared, the CB side of cells 94 and 96 can be averaged. Reading operations are simpler if the CBs of the reference cells are utilized to read CBs of data cells and the NBs of the reference cells are utilized to read NBs of data cells. The outputs of pass gates 98 are input into respective cascode amplifiers 100. The output of cascode amplifier 100 corresponding to the NB of the first reference cell 94 and the NB of the second reference cell is provided to an averager 102. The averager 102 provides an average value that corresponds to an average of a programmed bit and an unprogrammed bit. The output of the averager 102 is provided into a differential sense amplifier 104, which is compared with the output of the cascode corresponding to the NB of the data cell 92. The differential sense amplifier 104 provides an output corresponding to whether the NB of the data cell 92 is in a programmed state or an unprogrammed state.

Figure 6:
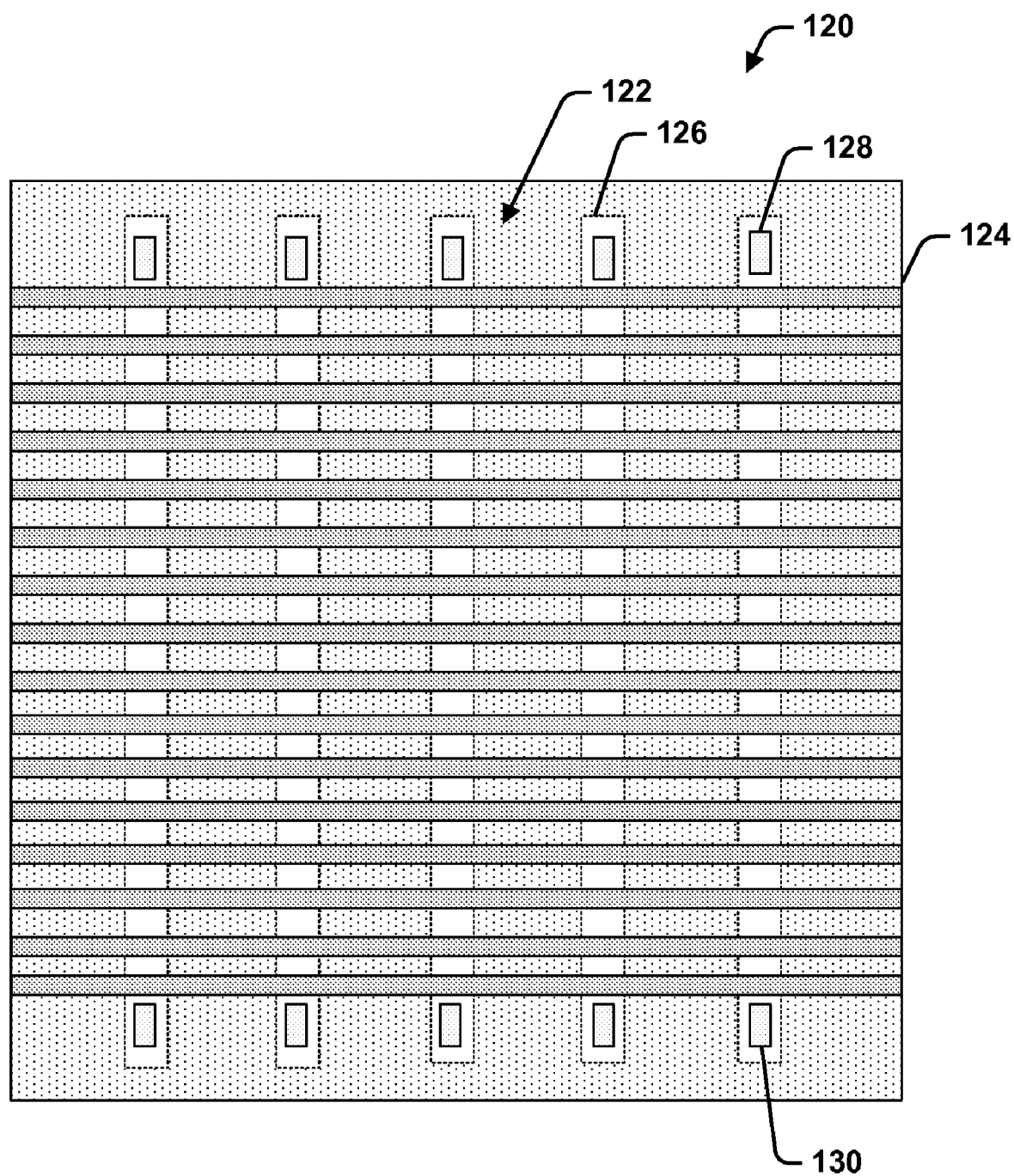
FIG. 6 illustrates a partial top view of a 64K sector of an array of dual bit flash memory in accordance with an aspect of the present invention.

Referring now to FIG. 6, there is illustrated a partial memory cell layout from a top or plan view of an example of a 64K block 120. The present example is illustrated with respect to a 64K block of 16 bit I/Os. It is to be appreciated that blocks may be 8-bit, 32-bit, 64-bit or more I/Os, and are not limited to 64K (e.g., 128K, 256K). The 64K block 120 can be a sector or a portion of a sector. For example, one or more blocks with the contacts connecting common metal bitlines can form a sector. An ONO stack strip or layer 122 extends a length of the memory array and includes the block 120. The block 120 includes 16 I/Os or groups of columns 126. Each "word" or group of IO's is comprised of eight transistors or eight normal bits and eight complimentary bits. Each I/O includes a polysilicon wordline 124 for addressing the rows of cells. A plurality of bit lines extend underneath the ONO stack strip layer 122 for enabling reading, writing and erasing of individual bits of the memory cells. Each bitline is connected to a first contact 128 and metal bitlines (not shown) at one end of a group of sixteen rows and a second contact 130 at the other end of the group. In the example of FIG. 6, five bit lines are illustrated such that a bitline is coupled to an end of every other transistor in a column and two select transistors are employed to select between four bits of two transistors for reading, writing and erasing.

Figure 7:
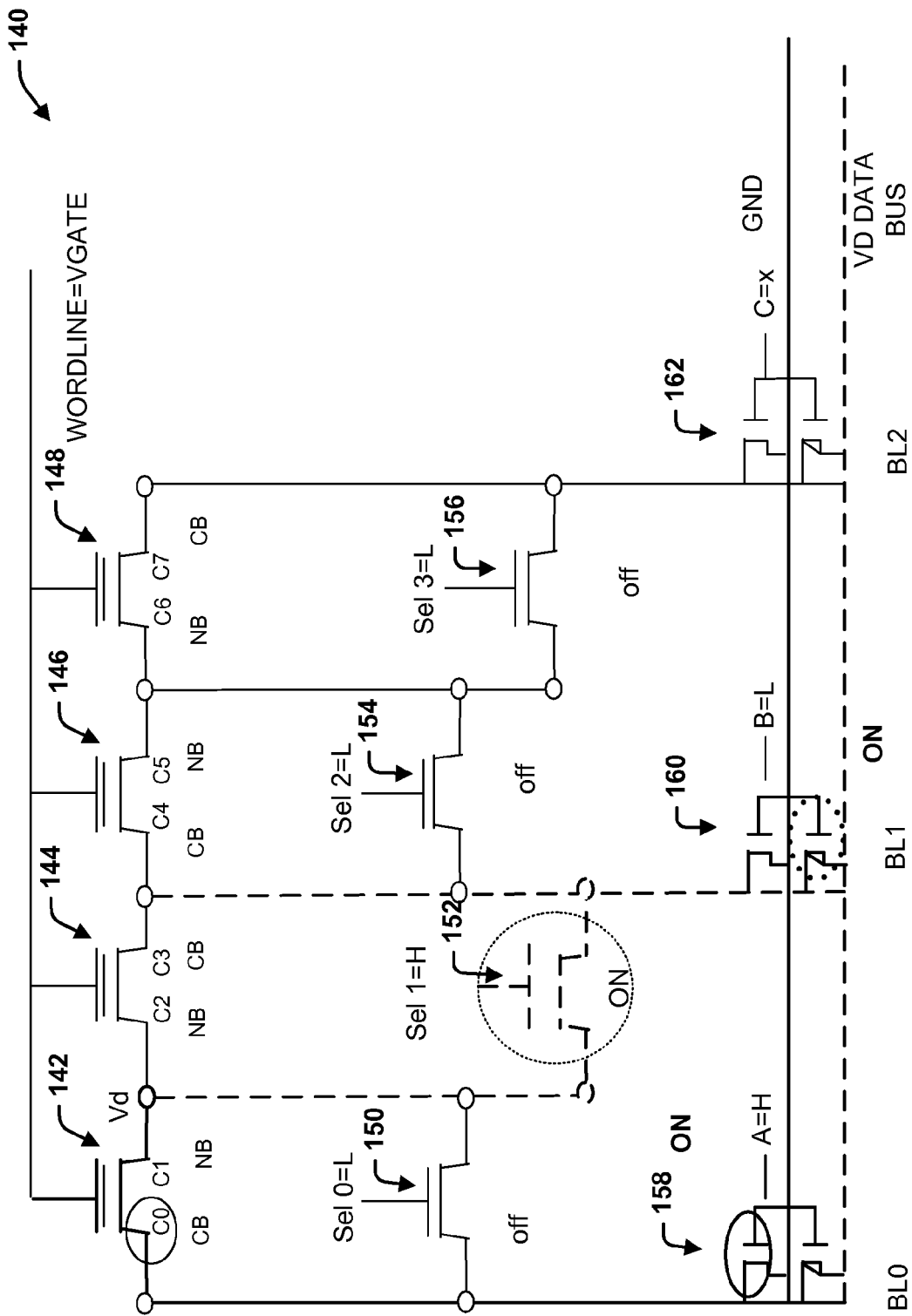
FIG. 7 illustrates a schematic view of a portion of a row of dual bit memory cells in accordance with an aspect of the present invention.

Referring now to FIG. 7, there is illustrated a schematic diagram of addressing of the first four dual bit memory cells in a row utilizing selection transistors and three bitlines for reading, writing and erasing bits. A first dual bit memory cell 142 includes a first bit C0 and a second bit C1, a second dual bit memory cell 144 includes a first bit C2 and a second bit C3, a third dual bit memory cell 146 includes a first bit C4 and a second bit C5 and a fourth dual bit memory cell 148 includes a first bit C6 and a second bit C7. The four dual bit memory cells could form a 8-bit word. A select gate 150 (Sel0) and a select gate 152 (Sel1) are provided to enable reading, writing and erasing of the bits C0, C1 of dual bit memory 142 and bits C2 and C3 of dual bit memory 144. A select gate 154 (Sel2) and a select gate 156 (Sel3) are provided to enable reading, writing and erasing of the bits C4, C5 of dual bit memory 146, and bits C6 and C7 of dual bit memory 148. A first switch 158 is connected to a first bitline BL0, a second switch 160 is connected to a second bitline BL1 and a third switch 162 is connected to a third bitline BL2. The first, second and third switches (158, 160, and 162) couple the corresponding bitline between power (VDD) and ground (GND). Any bit of the dual bit memory cells can be read by providing different voltage configurations as illustrated in Table 2 below. In the example depicted in FIG. 7, cell C0 of dual bit memory cell 142 is being read.

TABLE 2

Voltage Configurations for Reading Dual-Bit Memory.

| cell | WL | A | B | C | sel 0 | sel 1 | sel 2 | sel 3 | BL 0 | BL 1 | BL 2 |
|---|---|---|---|---|---|---|---|---|---|---|---|
| C0 | Vgate | H | L | x | L | H | L | L | GND | VD | X |
| C1 | Vgate | L | H | x | L | H | L | L | VD | GND | X |
| C2 | Vgate | H | L | x | H | L | L | L | GND | VD | X |
| C3 | Vgate | L | H | x | H | L | L | L | VD | GND | X |
| C4 | Vgate | x | H | L | L | L | L | H | X | GND | VD |
| C5 | Vgate | x | L | H | L | L | L | H | X | VD | GND |
| C6 | Vgate | x | H | L | L | L | H | L | X | GND | VD |
| C7 | Vgate | x | L | H | L | L | H | L | X | VD | GND |

Figure 8:
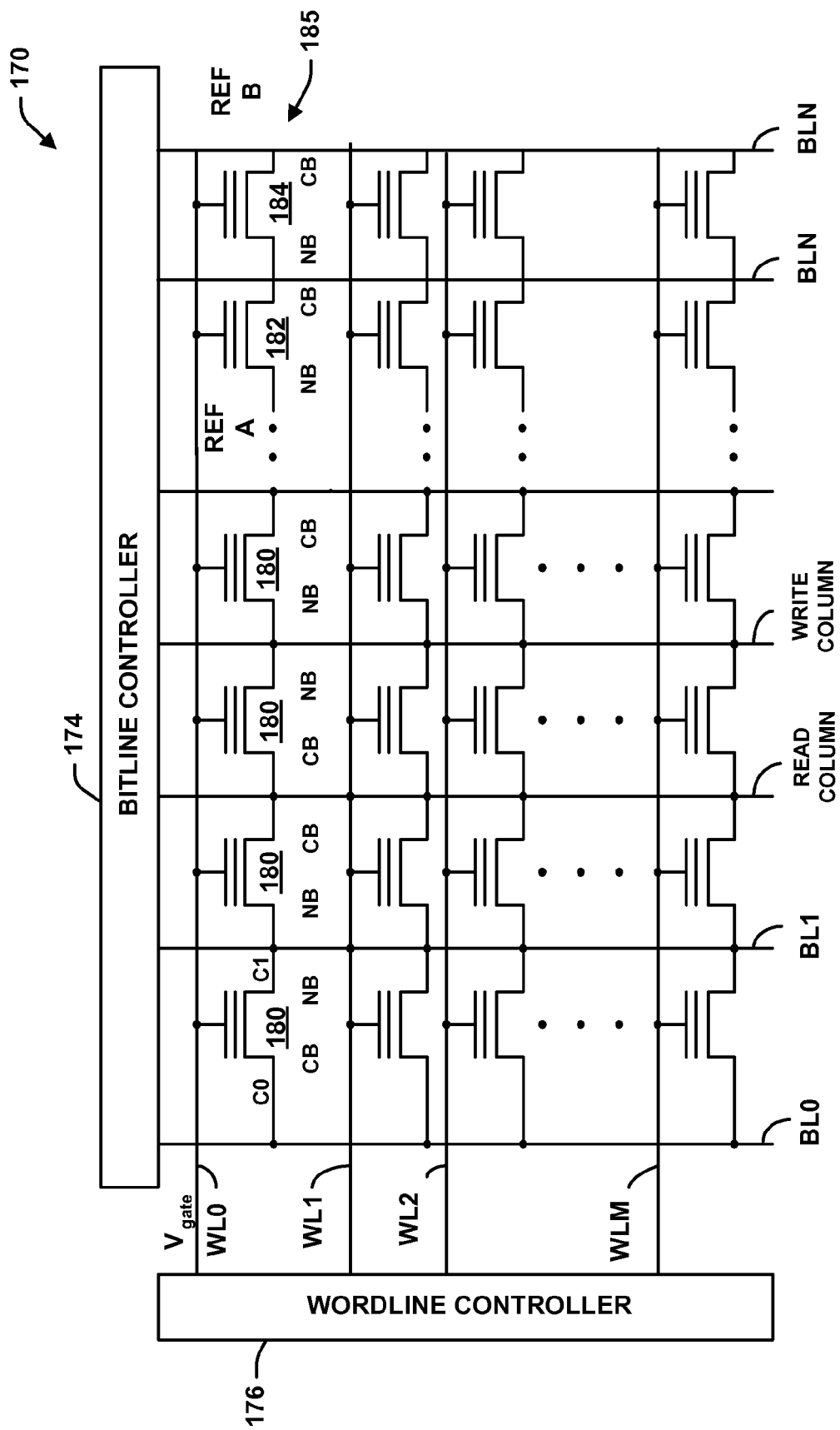
FIG. 8 illustrates a schematic block diagram of a system for reading a portion of a sector with a reference cell pair being associated with word lines in accordance with an aspect of the present invention.

Referring now to FIG. 8, there is illustrated a system 170 for reading a portion of a sector of cells 172 in accordance with an aspect of the present invention. The sector 172 is an array of double bit cells, such as cells 180. The system 170 includes a bitline controller 174 and a wordline controller 176 that decode I/Os during various operations that are performed on the sector 172 (e.g., programming, reading, verifying, erasing). The bitline controller 174 and wordline controller 176 receive address bus information from a system controller (not shown) or the like. Dual bit memory cells such as cells 180 are formed in M rows and N columns. A common wordline is attached to the gate of each cell in a row, such as wordlines WL0, WL1, WL2, through WLM. A common bitline is attached to each cell in a column, such as bitlines, BL0, BL1, through BLN. Associated with each wordline is a first dynamic reference memory cell 182 (REF A) and a second dynamic reference memory cell 184 (REF B). A wordline can contain, for example, 1000 bits forming multiple words, and a sector can include, for example, 512 wordlines to provide 512K bits of memory. The first dynamic reference memory cell 182 and the second dynamic reference memory cell 184 form a multi-bit reference pair 185 that is associated with a wordline, and used during reading of bits contained in words or multiple words for a corresponding wordline. This allows for process variations associated with data cells in a wordline to be reflected in the corresponding reference cells.

Figure 9:
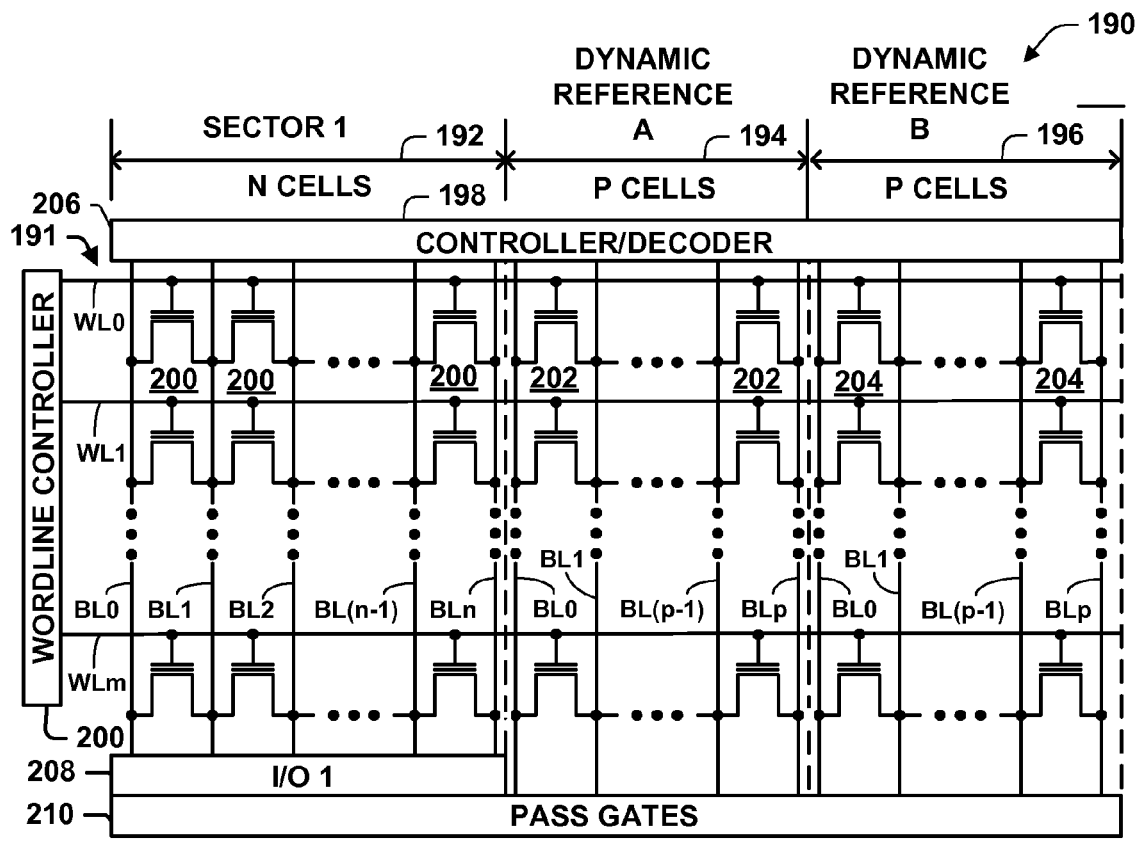
FIG. 9 illustrates a schematic block diagram of a system for reading a portion of a sector with a reference cell pair being associated with words in accordance with an aspect of the present invention.

Referring now to FIG. 9, there is illustrated a system 190 for reading a sector of cells 191 in accordance with an aspect of the present invention. The sector of cells 191 include a data sector portion 192, a dynamic reference A portion 194, and a dynamic reference B portion 196, wherein dynamic reference A 194 and dynamic reference B 196 make up a reference array. The dynamic reference A 194 and dynamic reference B 196 provide individual references associated with words in a wordline, such that each word is provided with associated references. Although the reference arrays are illustrated as separate structures, the reference cells can be interweaved within the data sector portion 192.

The sector 192 is illustrated as having N cells. It should be appreciated that the sectors in a memory array can have a variety of differing numbers of cells. Dynamic reference A 194 and dynamic reference B 196 are illustrated as having P cells each. The sector 192 includes a plurality of dual bit data cells 200, dynamic reference A 194 includes a plurality of dual bit reference cells 202, and dynamic reference B 196 includes a plurality of dual bit reference cells 204. The data cells 200 and corresponding reference cells 202 and 204 in an array are connected with common wordlines, such as WL0, WL1 through WLM in a row, and with common bitlines BL0-BLN in sector 192, BL0-BLP in dynamic reference A 194 and BL0-BLP in dynamic reference B 196. Note that the wordlines are common to both the dual bit cells in the sectors 192 as well as the reference arrays 194 and 196. A Controller/Decoder 206 controls the voltages to the individual bitlines and a wordline controller 200 controls the voltages to the individual wordlines. The bitlines in Sector 1 terminate in an I/O 202. Data from the I/O 202 and from the dynamic references A and B, are controlled by a series of pass gates 204.

Figure 10:
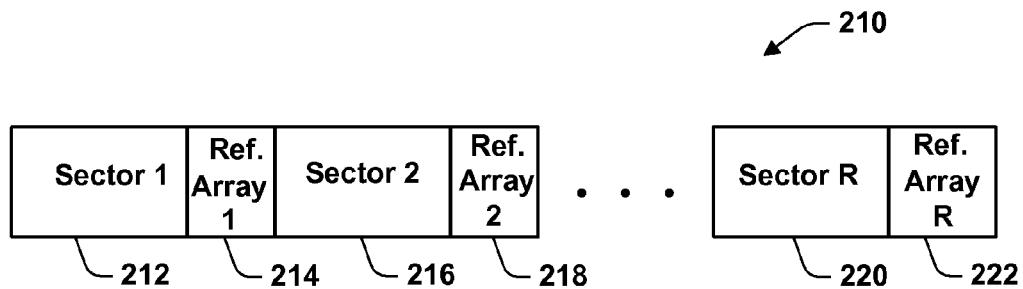
FIG. 10 illustrates a block diagram of architecture of a portion of a memory array in accordance with an aspect of the present invention.

Referring now to FIG. 10, there is illustrated an overview of architecture of a portion of a memory array 210 manufactured in accordance with the present invention and illustrates a first sector 212 with an associated reference array 214, a second sector 216 with an associated reference array 218, through a sector R 220 with an associated reference array 222. It should be appreciated that the order of the sectors can vary with the memory array 210 having sectors in a vertical configuration as well as in a horizontal configuration. In the portion of memory array 210, a reference array can include a first reference and a second reference that is associated with a word, a wordline or an entire sector. A programmed bit of the first reference and an unprogrammed bit of a second reference are employed to determine an average threshold value that is utilized during reading of data bits in the associated sector.

Figure 11:
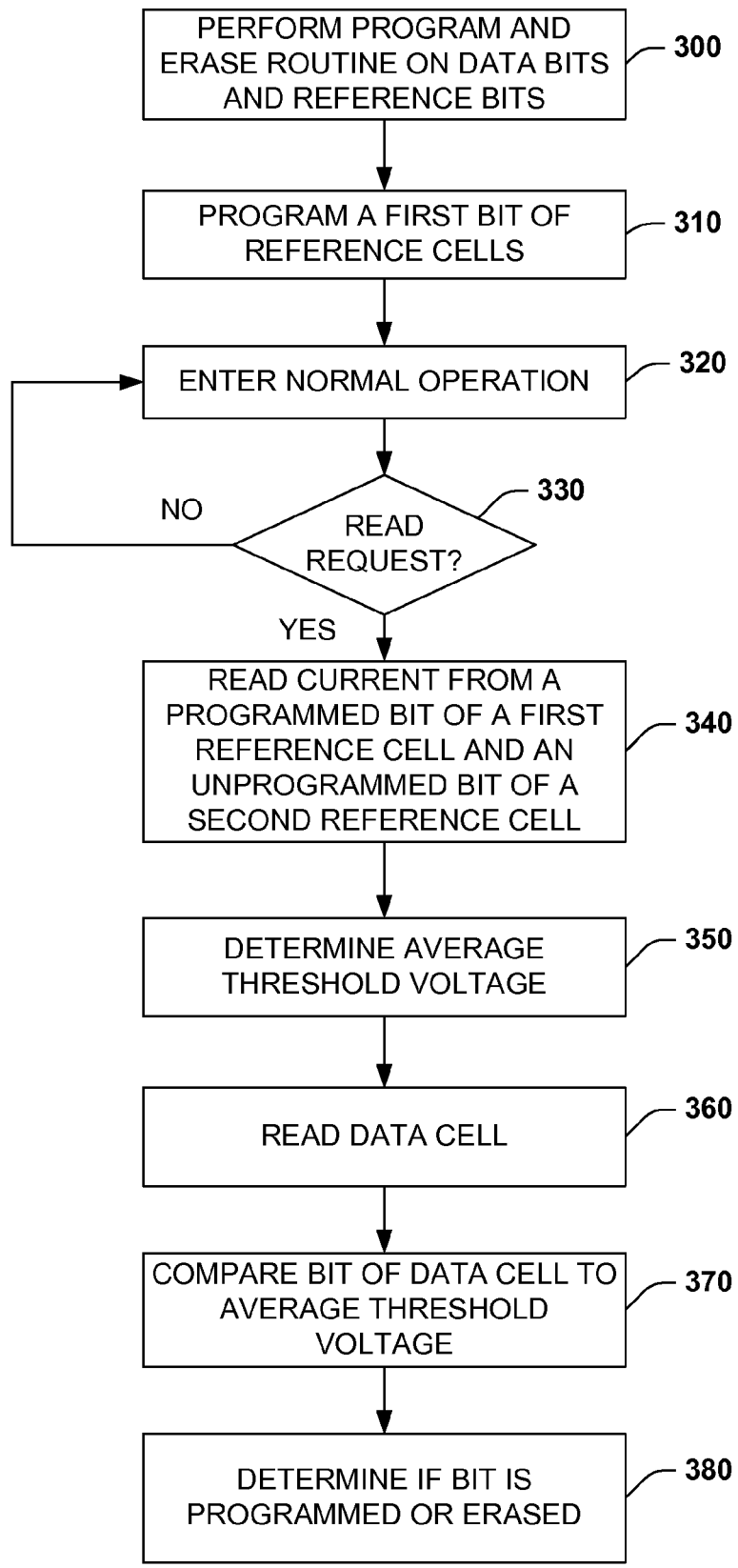
FIG. 11 illustrates a flow diagram of a methodology for performing a read operation in accordance with an aspect of the invention.

In view of the foregoing structural and functional features described above, a methodology in accordance with various aspects of the present invention will be better appreciated with reference to FIG. 11. While, for purposes of simplicity of explanation, the methodology of FIG. 11 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect the present invention.

Referring now to FIG. 11, there is illustrated one particular methodology for performing a read operation of one or more data bits of a multi-bit memory cell structure in accordance with one aspect of the present invention. The method begins at 300 where a program and erase routine is performed. The program and erase routine programs the data bits and reference bits in a portion of memory. The portion of memory can be a sector, a block or an entire memory device. The program and erase routine then erases the data bits and the reference bits. The methodology then advances to 310. At 310, the methodology programs a first bit of the reference cells of a reference cell pair. The reference cells can include a first reference cell and a second reference cell that corresponds to a word, a wordline or an entire sector. The first reference cell tracks charge loss on a programmed bit due to program and erase cycling of the multi-bit memory cell structure over time. The second reference cell tracks the effects of CBD on an unprogrammed or an erased bit of a memory cell of the multi-bit memory cell structure over time. The methodology then proceeds to 320 to begin normal operation.

During normal operation, write operations are performed to set the data bits of memory cells of the multi-bit memory cell structure to a programmed state or an unprogrammed state. For example, write operations can be performed to program an entire sector, a block or structure to perform specified program functions. Additionally, some portions can be programmed during operation of the device containing the multi-bit memory cell structure, such that data can be stored in the memory structure in addition to program routines. The methodology then proceeds to 330 to determine if a read request has been invoked.

If a read request has not been invoked (NO), the methodology returns to 320 to continue executing normal operation. If a read request has been invoked (YES), the methodology proceeds to 340. At 340, read currents are read from a programmed bit of a first reference cell and an erased or unprogrammed bit of a second reference cell. As discussed above, the programmed bit tracks the charge loss of the multi-bit memory cell structure over time and the unprogrammed bit tracks the effects of CBD on an unprogrammed bit of the multi-bit memory cell structure over time. At 350, an average threshold value is determined employing the read currents of the programmed bit of the first reference and the unprogrammed bit of the second reference. The average threshold value can be an average read current or converted to an average threshold voltage.

At 360, one or more bits are read from the multi-bit memory cell structure. For example, a word can be read, a plurality of words or a sector. At 370, a bit of a data cell is compared to the average threshold value. The methodology then proceeds to 380 to determine if the bit is programmed or unprogrammed. For example, a bit having a read value above the average threshold value can be considered a programmed bit, while a bit having a read value below an average threshold value can be considered an unprogrammed bit. The methodology repeats the comparing of 370 and determining of 380 for the remaining bits that are being read. Alternatively, the comparing of 370 and determining of 380 can be performed concurrently on bits in a word, a wordline or a sector.

Figure 12:
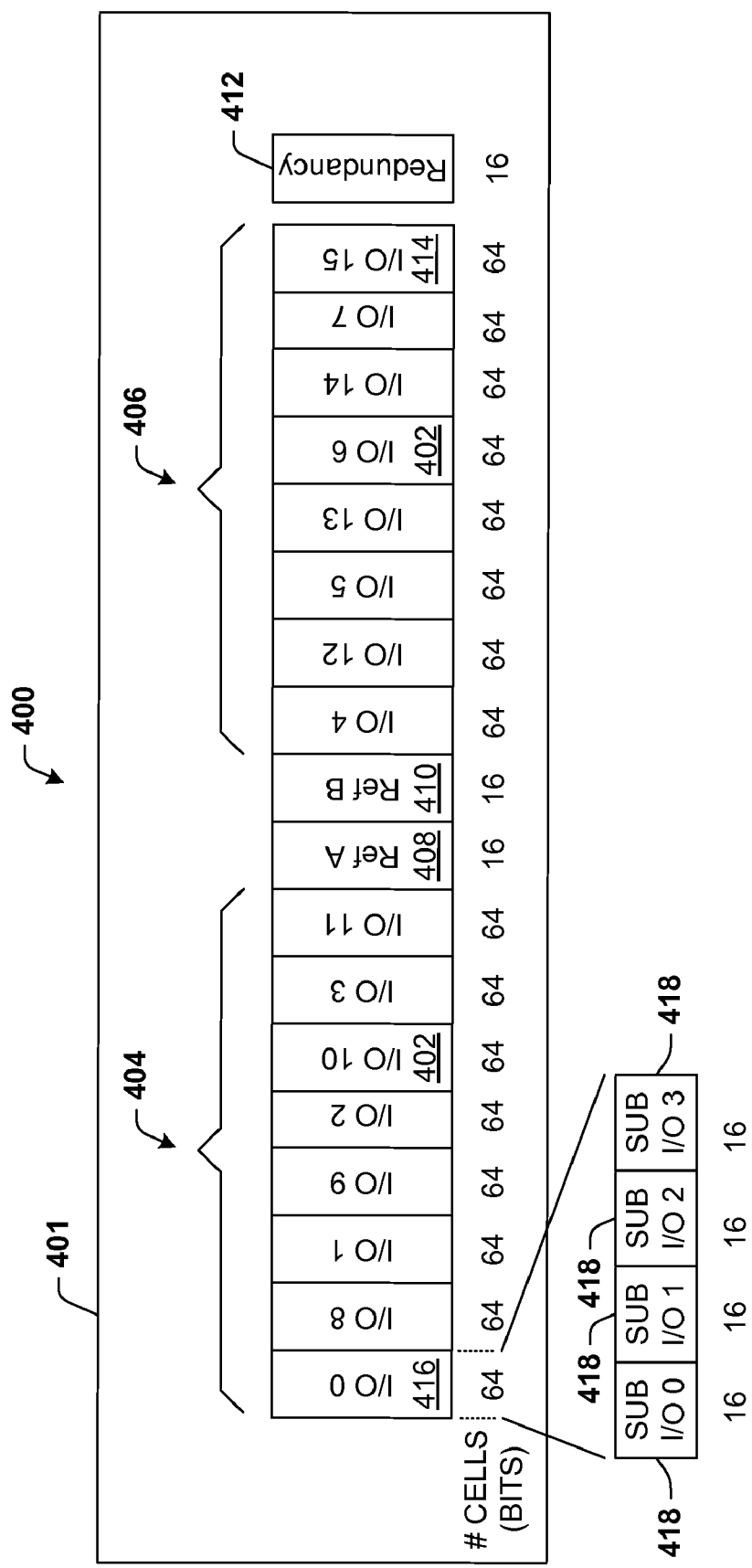
FIG. 12 illustrates a sector output configuration of a flash memory array of present invention.

Referring now to FIG. 12, there is illustrated a sector output configuration of a flash memory array 400 of present invention. In the present example, the memory array 400 is fabricated on a memory core 401, and is comprised of sixteen 64-cell I/O sections (or sectors) 402 (similar to sectors 64, 172, and 192) of dual-bit data cells: a first set 404 of eight I/O sections and a second set 406 of eight I/O sections. Additionally, the array 400 includes two 16-cell reference array sections: a first reference array section 408 (also denoted Ref A, and similar to reference arrays 66 and 194) including a plurality of dual-bit reference A cells, and second reference array section 410 (also denoted Ref B, and similar to reference arrays 68 and 196) including a plurality of dual-bit reference B cells. The first and second references (408 and 410) are fabricated adjacent to each other, and both are fabricated inbetween the first set 404 of I/O sections and the second set 406 of I/O sections. Thus the first reference 408 is dedicated to the first set 404 of I/O sections and the second reference 410 is dedicated to the second set 406 of I/O sections. However, as indicated hereinabove, the reference arrays (408 and 410) may be fabricated together as reference array pairs, wherein each reference array pair is dedicated to a single sector. Thus there is a plurality of reference array pairs fabricated with corresponding sectors on the core 401.

The dynamic referencing circuitry is placed internal to the chip, that is, on the core 401 such that referencing can be performed dynamically among a number of different multi-bit reference pairs of the core 401. Thus there is provided a more accurate representation of the reference voltage to the data cells of the core 401. The invention includes placing the voltage reference cells on the core 401 and cycling the reference voltage cells along with the data cells such that the effects of aging on the reference voltage is significantly reduced.

The first set 404 of eight I/O sections are labeled 0, 1, 2, 3, 8, 9, 10, and 11, but fabricated in the following order from the outside inward to the first reference section 408: 0, 8, 1, 9, 2, 10, 3, 11. The second set 406 of eight I/O sections are labeled 4, 5, 6, 7, 12, 13, 14, and 15, but are fabricated in the following order from the inside, next to the second reference section 410, to the outside: 4, 12, 5, 13, 6, 14, 7, and 15.

A single 16-cell redundancy section 412 is fabricated proximate to, but not adjacent to, a last outer I/O section 414 (also denoted section I/O 15) of the second set 406 of I/O sections. The redundancy sector 112 is fabricated at the right side of the regular array 400 with a 1.1 μm (on mask) separation. However, it is to be appreciated that this separation may be greater, less, or even with no separation at all from the array 400.

Each I/O section 402 of the first and second sets (404 and 406) is further subdivided into four sub-I/O sections 418 of sixteen cells (or bits) each. Each sub-I/O section 418 also comprises a word. This architecture utilizes a 4-word page read operation. For example, a section 416, also denoted as I/O 0, includes four 16-bit sub-I/O sections 418, further denoted respectively as Sub I/O 0, Sub I/O 1, Sub I/O 2 and Sub I/O 3, and decoded by reference A(1:0).

There are eight main M2 (or Metal2) bit lines per word decoded by A(6:2) with two diffusion (or M1) bit lines per M2 bit lines decoded by A(2).

It is appreciated that the memory array 400 could be any number of different configurations, for example, 128K sectors comprised of eight normal bits and eight complimentary bits on eight cells. In addition, any number of sectors 402 may be employed limited only by the size of the application and the size of the device employing the flash memory array 400.

Figure 13:
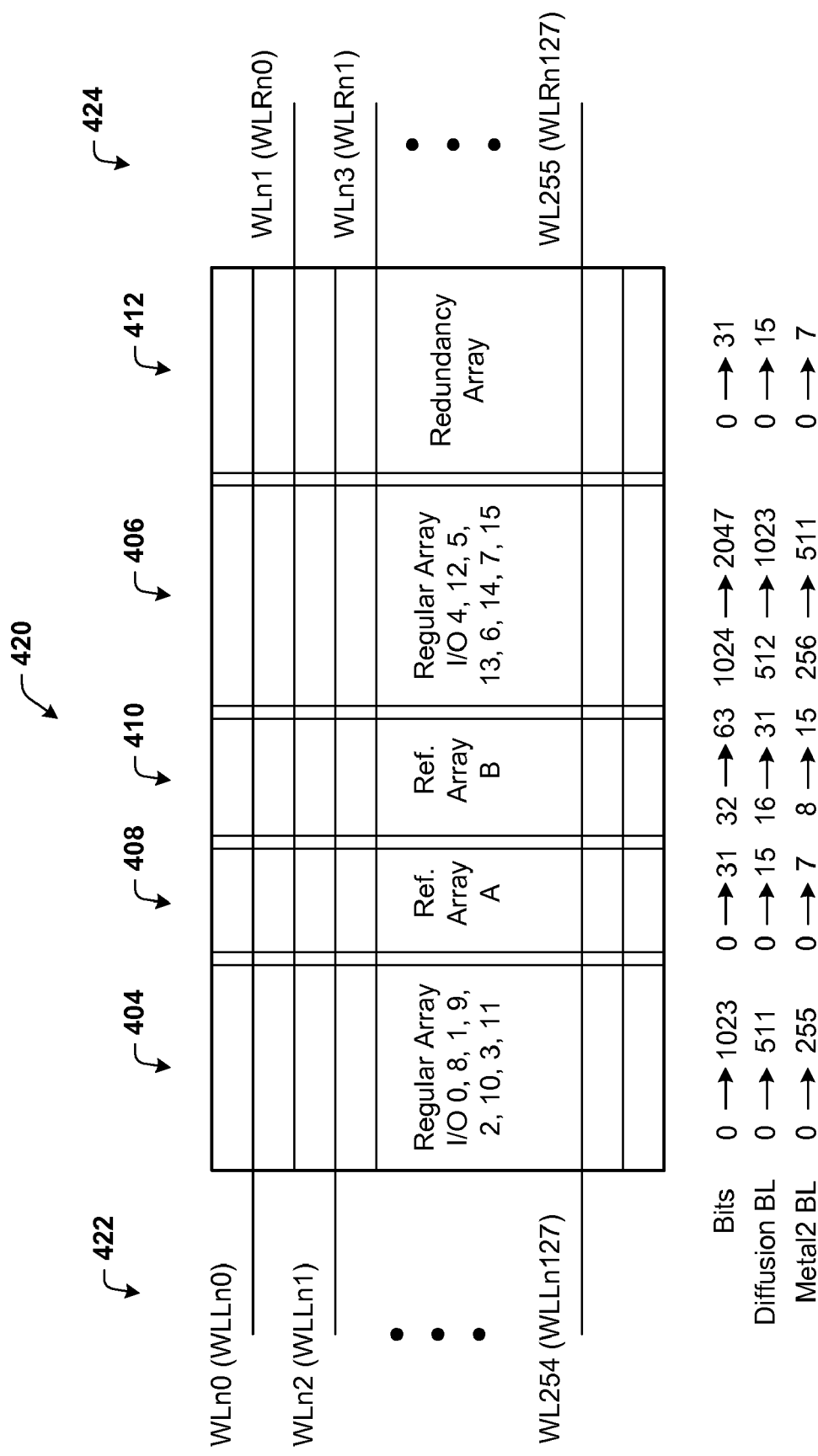
FIG. 13 illustrates a sector array configuration diagram for the dynamic referencing architecture of the present invention.

Referring now to FIG. 13, there is illustrated a sector array configuration 420 diagram for the dynamic referencing architecture of the present invention. The array configuration 420 illustrates the wordlines and bitlines for the circuit layout of the present invention. As indicated hereinabove, the first set 404 of I/O sections, first reference section 408, second set 406 of I/O sections, second reference 410, and redundancy section 412 are oriented accordingly. Wordline reads are performed in an interleaved fashion between the left side and the right side. That is to say that a section I/O will be read from the first set 404 and, first and second references (408 and 410), followed by the reading of a section I/O from the second set 406 of I/O sections and, first and second references (408 and 410). In furtherance thereof, a set of one hundred twenty-eight left wordlines 422 (also denoted WLLn0-WLLn127) are utilized to access the first set 404 of I/O sections and the first reference section 408. A set of one hundred twenty-eight right wordlines 424 (also denoted WLRn0-WLRn127) are utilized to access the second set 406 of I/O sections and the second reference section 410. The left wordlines are labeled WLn0, WLn2, WLn4, . . . , WLn254, whereas the right wordlines are labeled WLn1, WLn3, WLn5, . . . , WLn255. With such a physical orientation, interleaved reading is accomplished by reading wordlines incrementally from top to bottom, i.e., WLn0, WLn1, WLn2, WLn3, etc.

Each of the first and second sets (404 and 406) of I/O sections has associated therewith 512 cells (or 1024 bits), which is 512 diffusion bitlines and 256 Metal2 bitlines. Each of the first and second references (408 and 410) has thirty-two bits, which is sixteen diffusion bitlines, and eight Metal2 bitlines. The redundancy section 412 has thirty-two bits, which is sixteen diffusion bitlines and eight Metal2 bitlines. All sectors are placed in the same orientation (i.e., stepped, with no flipping).

Figure 14:
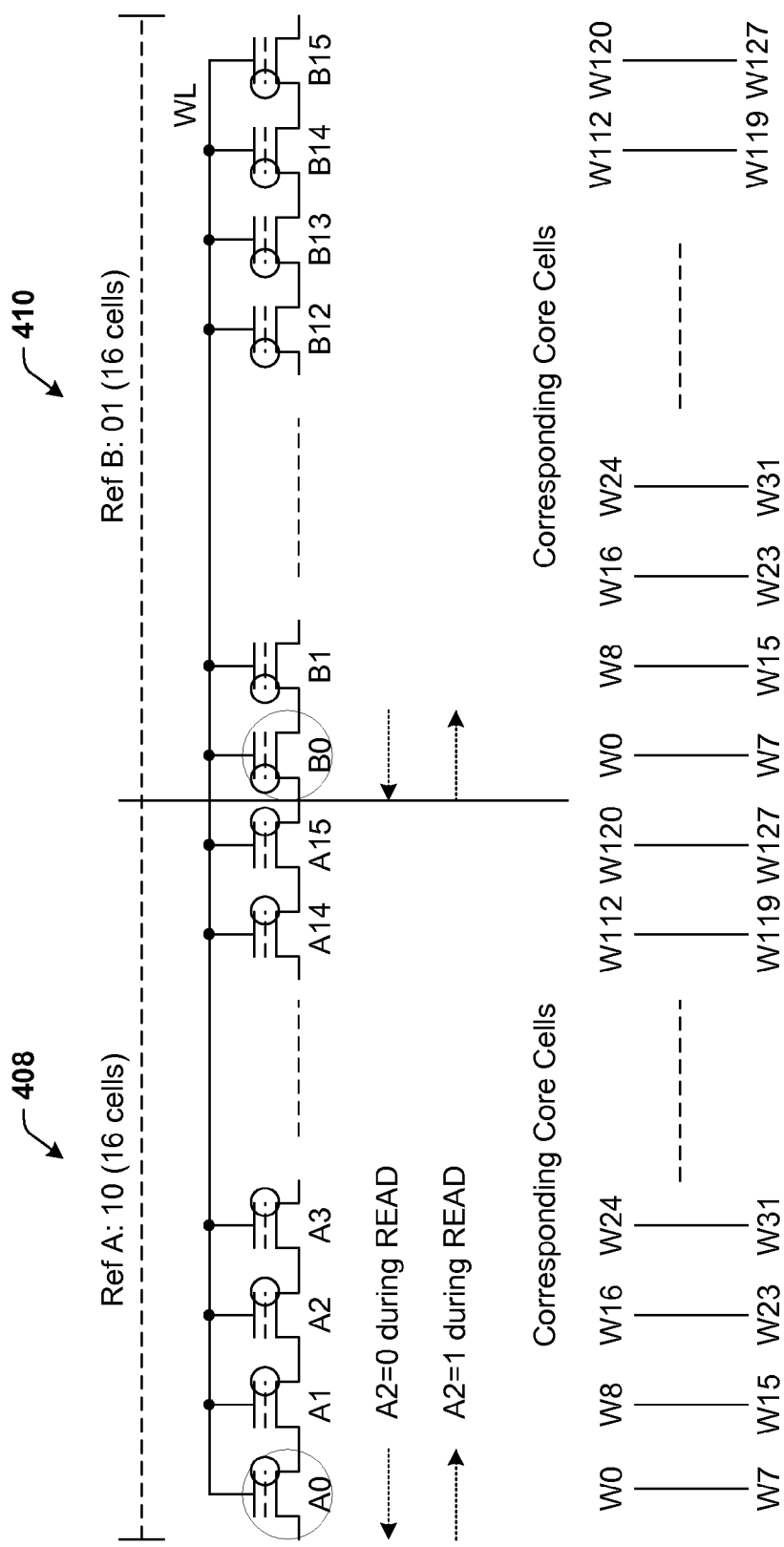
FIG. 14 illustrates a schematic diagram of a wordline for the reference sections of the present invention.

Referring now to FIG. 14, there is illustrated a schematic diagram of a wordline for the reference sections of the present invention. The first reference array section 408 comprises sixteen transistors denoted A0-A15, and the second reference array section 410 comprises sixteen transistors denoted B0-B15. The reference cells are configured to work in A/B pairs. That is, a first reference cell A0 of the first reference section 408 (REF A) operates in conjunction with a first reference cell B0 of the second reference section 410 (REF B) to decode an I/O section sub-I/O cell. More specifically, references pairs A0/B0 are utilized to select words W0-W7, pair A1/B1 for words W8-W15, pair A2/B2 for words W16-W23, pair A3/B3 for words W24-W31, pair A4/B4 for words W32-W39, pair A5/B5 for words W40-W47, pair A6/B6 for words W48-W55, pair A7/B7 for words W56-W63, pair A8/B8 for words W64-W71, pair A9/B9 for words W72-W79, pair A10/B10 for words W80-W87, pair A11/B11 for words W88-W95, pair A12/B12 for words W96-W103, pair A13/B13 for words W104-W111, pair A14/B14 for words W112-W119, and pair A15/B15 for words W120-W127.

There are two data arrays of sixteen I/O sections each containing 1024 cells of two bits each for a total of 2048 bits in each of the data arrays. Each I/O section is sixty-four cells, and each I/O has four sub-I/O's (totaling sixty-four sub-I/O's for the two data arrays). Thus a sub-I/O includes sixteen cells, which sixteen cells are called a word. As indicated above, a page read of a sub-I/O includes four words. Each reference array, Ref A and Ref B, has the same number of cells at a sub-I/O (i.e., sixteen), as does the redundancy section. This gives better decoding loading and matching.

Each sub-I/O has four sensing circuits, or one per sub-I/O. Thus when considering the data arrays (sixty-four sensing circuits), Ref A (one sensing circuit), Ref B (one sensing circuit), and the redundancy section (one sensing circuit), there is a total of sixty-seven sensing circuits.

Each reference array sector (408 and 410) corresponds to sixteen bit lines. That is, the first reference array sector 408 corresponds to bit lines A0-A15, and the second reference array sector 410 corresponds to bit lines B0-B15. Each AB reference pair corresponds to an 8-bit word (or 8-word) core cell (i.e., a 4-word NB and a 4-word CB). Thus if the page write size is 16-word, there are two reference pairs associated with the 16-word page. Each wordline (WL) has associated therewith 1024 core cells (equivalent to 2048 bits or 128 words), dummy cells and redundancy cells. More specifically, each WL accommodates the loading of (or writing into), 5 (dummy)+512 (first eight array cells)+16 (REF A)+16 (REF B)+512 (second eight array cells)+5 (dummy)+5 (dummy)+16 (redundancy)+5 (dummy)=1092 cells.

When referencing the reference cells, corresponding bits are read in order to obtain the corresponding values. Thus when the left bit of cell A0 of Ref A is read (denoted by the left pointing arrow, A2=0), the same left bit of the B0 cell is read to obtain the binary 01 level value of Ref B. Note that the reference levels can be reversed such that the right bit (denoted by the right pointing arrow, A2=1) of the A0 cell of Ref A is read at a binary 01 level and the right bit of the B0 cell of Ref B is a binary 10 level. Averaging will still result in the same value as before such that a reliable reference is obtained.

Precharging of the reference cells is preferred to reduce the transmitting effect. The program order for the precharge of the reference cells in this particular embodiment is from the inside to the outside, that is: A15/B0, A14/B1, A13/B2, A12/B3, A11/B4, A10/B5, A9/B6, A8/B7, A7/B8, A6/B9, A5/B10, A4/B11, A3/B12, A2/B13, A1/B14, and A0/B15. This has the advantage is minimizing the transmitting effect by providing charge before reading the reference values such that the values can be transmitted with sufficient speed.

What has been described above includes examples of the present invention. It is, of course, not possible to describe every conceivable combination of components or methodologies for purposes of describing the present invention, but one of ordinary skill in the art may recognize that many further combinations and permutations of the present invention are possible. Accordingly, the present invention is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A method associated with a multi-bit memory cell having a redundancy array located proximate or adjacent to groups of data sectors, comprising,
    pre-charging first and second reference arrays each comprised of a plurality of reference cells wherein a program order for precharging the reference cells in the first and second reference arrays is from a last reference cell in the first reference array and a first reference cell in the second reference array to a first reference cell in the first reference array and a last reference cell in the second reference array to reduce transmitting effect prior to averaging voltage levels associated therewith; and
    averaging a first bit value of a first reference cell of the first reference array with a second bit value of a second reference cell of the second reference array to generate a reference voltage for use with a data cell read operation.

2. The method of claim 1, further comprising cycling the first bit of the first reference cell so that the first bit ages with a corresponding data bit.

3. The method of claim 1, further comprising comparing the reference voltage value with a voltage value obtained from a data bit to determine if the data bit is in a programmed state or an unprogrammed state.

4. The method of claim 1, further comprising amplifiers that amplify voltages obtained from the first reference cell and the second reference cell.

5. The method of claim 1, the first and second reference arrays are fabricated adjacent to each other.

6. The method of claim 1, further comprising cycling the second bit of the second reference cell so that the second bit ages with the corresponding data bit.

7. The method of claim 1, wherein the averaging of the first bit value and the second bit value is performed by a voltage divider.

8. The method of claim 1, further comprising controlling a plurality of select gates that enable reading, writing and erasing of reference cells associated with the first and second reference arrays.

9. The method of claim 1, the first bit and the second bit are associated with the multi-bit memory cell in a wordline, the first bit and the second bit utilized during reading of bits in the wordline.

10. The method of claim 1, the first and second reference arrays are located centrally of the groups of data sectors.

11. The method of claim 1, further comprising reading bits associated with the groups of data sectors in an interleaved manner with bits associated with the first and second reference arrays.

12. The method of claim 1, further comprising controlling a plurality of switches that connect bitlines associated with reference cells of the first and second reference arrays to power (VDD) or ground (GND) to facilitate a read operation.

13. The method of claim 1, further comprising:
    summing currents from the first bit and the second bit to produce a resulting current; and
    converting the resulting current to a summed voltage, wherein the summed voltage is used to produce the reference voltage.

* * * * *